United States Patent [19]
Derkits, Jr. et al.

[11] Patent Number: 5,861,665
[45] Date of Patent: Jan. 19, 1999

[54] STRUCTURE FOR ABSORPTION OF HYDROGEN IN A PACKAGE

[75] Inventors: Gustav Edward Derkits, Jr., New Providence; John Lopata, North Plainfield; Franklin Richard Nash, Princeton, all of N.J.

[73] Assignee: Lucent Technologies Inc., Murray Hill, N.J.

[21] Appl. No.: 853,735

[22] Filed: May 13, 1997

[51] Int. Cl.[6] .................................................. H01L 23/20
[52] U.S. Cl. ........................... 257/682; 257/680; 257/704
[58] Field of Search ................................... 257/682, 680, 257/704

[56] References Cited

U.S. PATENT DOCUMENTS 4,769,345  9/1988  Butt et al. .
5,491,361  2/1996  Stupian et al. .

*Primary Examiner*—Mahshid D. Saadat
*Assistant Examiner*—S. V. Clark
*Attorney, Agent, or Firm*—Lester H. Birnbaum

[57] ABSTRACT

Disclosed is an optical and/or microelectronics hermetic package which includes a member for absorbing hydrogen from the internal package ambient. The member includes a first layer which forms a hydride and, formed thereover, a second layer which forms solvated hydrogen upon exposure to molecular hydrogen in the package. The second layer acts as a one way valve for transporting hydrogen to the first layer which locks up the hydrogen.

10 Claims, 3 Drawing Sheets

STRUCTURE FOR ABSORPTION OF HYDROGEN IN A PACKAGE

FIELD OF THE INVENTION

This invention relates to optical and/or microelectronics hermetic packages, and in particular, to a structure for reduction or elimination of hydrogen from the package.

BACKGROUND OF THE INVENTION

Hydrogen is a common cause of damage and failure of optical and microelectronic components and circuits. For example, titanium/platinum/gold metallization used in a wide variety of optical and microelectronics packages and hybrid circuits is susceptible to attack. This damage can be significant especially when the components are in an hermetic package, since the packaging material and packaged components can emit hydrogen over a period of time. Hydrogen from the package material can ultimately amount to 1–3 percent of the total pressure inside the package. The problem is particularly troublesome in the area of submarine lightwave systems where the packages cannot be easily repaired or replaced.

It is, therefore, desirable to provide a structure within a package which will reduce or eliminate gaseous hydrogen from the package interior.

SUMMARY OF THE INVENTION

The invention is an hermetic package which includes a housing for enclosing components. Within the housing is a member, separate from the components, which comprises a first layer of a material which forms a hydride when subject to solvated hydrogen, and a second layer formed over the first layer, the second layer comprising a noble metal material which forms solvated hydrogen when subject to molecular hydrogen. The second layer prevents the formation of a surface oxide and acts as a one way valve for the transport of hydrogen from the package ambient to the first layer, which serves to lock-up the hydrogen as a hydride.

BRIEF DESCRIPTION OF THE DRAWING

These and other features of the invention are delineated in detail in the following description. In the drawing.

It will be appreciated that, for purposes of illustration, these figures are not necessarily drawn to scale.

DETAILED DESCRIPTION

Figure 1:
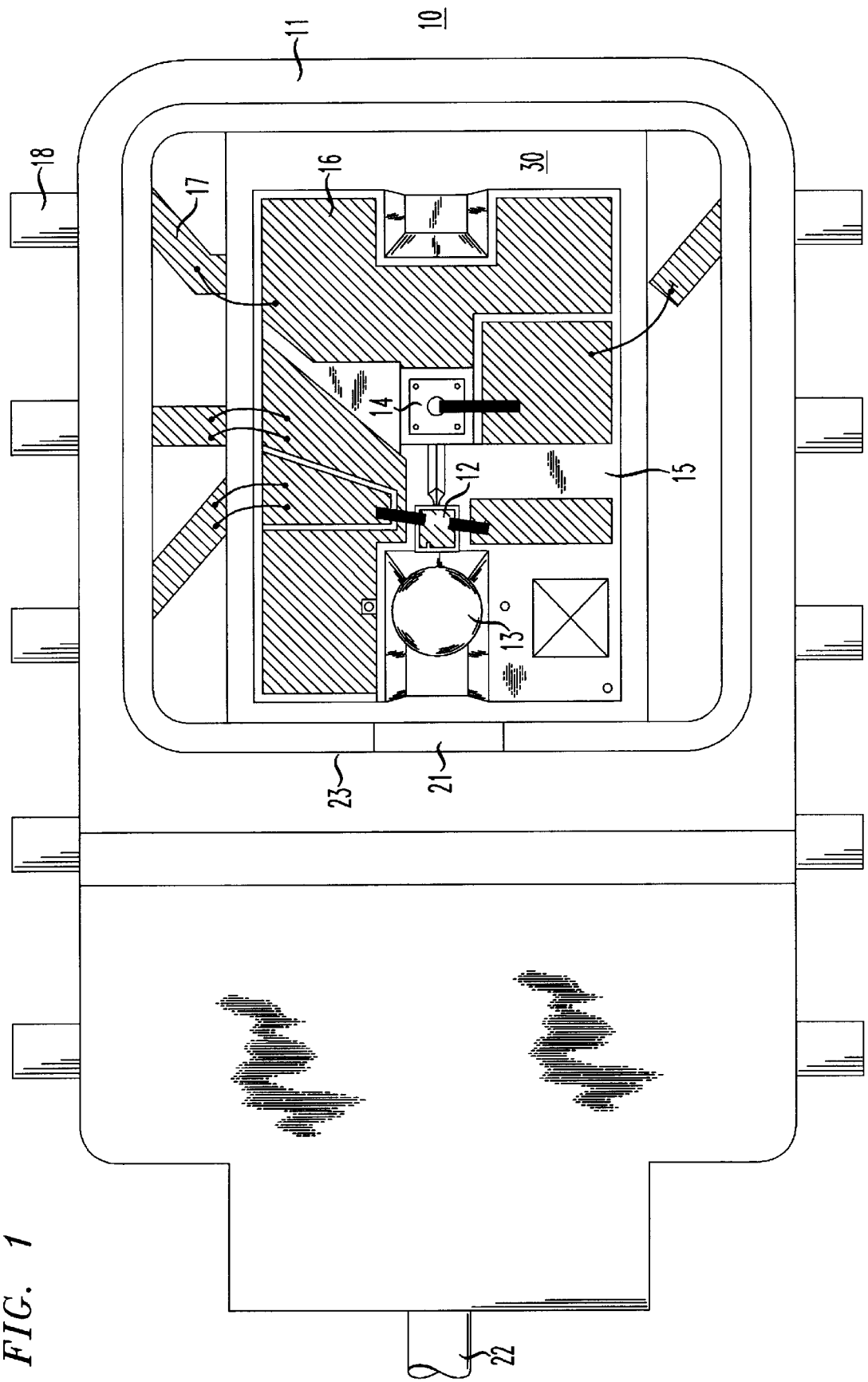
FIG. 1 is a top view, partly cut away, of a package which includes the present invention in accordance with one embodiment.
Figure 2:
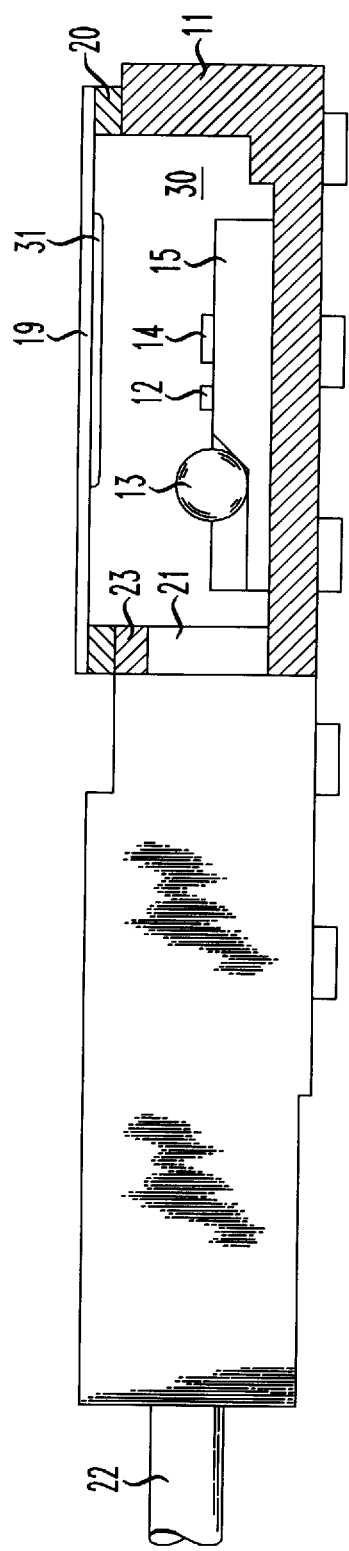
FIG. 2 is a side view, partly cut away, of the package shown in FIG. 1.

Referring now to the drawings, in which like reference numerals identify similar or identical elements, FIGS. 1 and 2 illustrate a typical optoelectronics package which includes the invention. In this example, the package, 10, is an optoelectronics package which includes a housing, 11, defining a cavity, 30, for the optoelectronics components. The optoelectronics components include a laser, 12, a spherical lens, 13, for focusing the laser light, and a photodetector, 14, for monitoring the laser light. The components, 12–14, are mounted on a substrate, 15, which is typically silicon. The substrate, in turn, is mounted to the bottom surface of the cavity, 30.

As illustrated in FIG. 1, the silicon substrate, 15, includes metallization, 16, on its surface for providing electrical contact to the components, 12 and 14. The metallization, 16, is wire bonded to metallization, 17, on a ledge in the cavity so that the components can be electrically contacted to the outside world through pins, e.g., 18, extending from the sides of the package. The metallization, 16 and 17, is typically made of layers of titanium/platinum/gold. The cavity, 30, is hermetically sealed by means of a lid, 19, which is bonded to the top surface of the housing by solder, 20 as shown in FIG. 2. The laser, 12, is optically coupled to an optical fiber, 22, through an aperture, 21, in a wall, 23, in the cavity, 30.

Although the cavity, 30, is hermetically sealed by lid, 19, the metallization, 16 and 17, can be subject to delamination by hydrogen gas since the material of the housing, 11, can itself emit hydrogen gas. In some cases, the amount of hydrogen gas within the package ambient can be as high as 1–3 percent of the total internal pressure.

Figure 3:
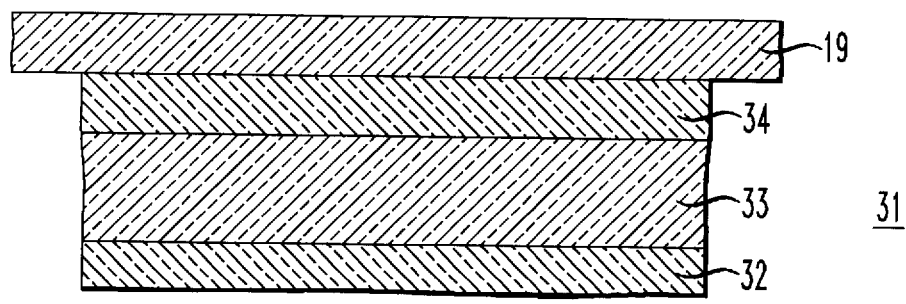
FIG. 3 is a cross sectional view of a member for the absorption of hydrogen in accordance with the same embodiment.

In order to reduce the amount of hydrogen gas in the cavity, 30, the cavity includes a member, 31, which in this example is attached to the inner surface of the lid, 19, but could be mounted anywhere in the cavity. This member is shown in more detail in FIG. 3. In particular, the member, 31, includes a layer, 32, which is exposed to the package ambient. This layer is preferably a noble metal such as platinum, which typically has a thickness within the range 50 nanometers to 500 nanometers. The layer, 32, is formed on another layer or substrate, 33, typically by vacuum evaporation, sputtering, or other means known to those skilled in the art. The layer, 33, is a hydride forming material such as titanium or zirconium, and typically has a thickness greater than 200 nanometers. The bilayer structure is bonded to the inner surface of the lid, 19, by means of a bonding layer, 34, such as solder. Alternatively, the two layers, 32 and 33, can be deposited onto the lid by standard techniques, such as vacuum evaporation, sputtering, or other means known to those skilled in the art. In order to achieve significant absorption of hydrogen as described below, it is recommended that the member, 31, occupy an area of at least one percent of the interior package area or greater than 10x the total area of exposed at-risk material in the devices to be protected, whichever is the greater. ("At risk" material is the material in the package which is susceptible to hydrogen damage.) In a typical single-circuit or small hybrid electrical package, the area may be 0.1–0.4 $cm^2$.

Figure 4:
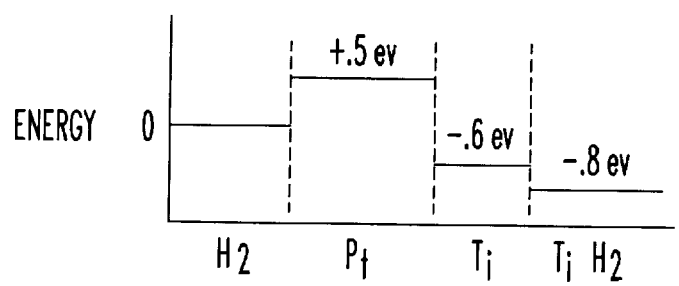
FIG. 4 is an energy diagram illustrating operation of the invention in accordance with the same embodiment.

In operation, hydrogen from the package ambient is adsorbed on the surface of the platinum layer, 32, and is transmitted to the interior of that layer by conversion of molecular hydrogen to solvated hydrogen within the metal structure. This reaction is endothermic, and in the case of platinum, requires approximately 0.5 eV per H atom as illustrated in the energy diagram of FIG. 4. The solvated hydrogen moves into the titanium layer, 33, by an exothermic reaction which releases approximately 1.1 eV per atom. The solvated hydrogen then precipitates as titanium hydride in another exothermic reaction which releases approximately 0.2 eV per atom. The exothermic reactions serve to lock up the hydrogen in the titanium layer, 33, and prevent its return to the platinum layer, 32, due to the presence of the energy barrier created thereby. Use of the noble metal, 32, prevents the formation of a surface oxide on the reactive (hydride-forming) metal, 33, thereby keeping the surface "open" to admit hydrogen. It may also promote the movement of hydrogen into the hydride-forming metal by the presence of an energy barrier, but that is a secondary function. Thus, the noble metal layer,32 acts as a one way valve for the admission of hydrogen into the hydride forming layer,33.

The element, 31, was incorporated into several standard pump laser packages by depositing the metals on the package lid and hermetically sealing the package so that the internal ambient was primarily $N_2$. The packages were then aged for 1840 hours at 100 degrees C. These packages had no detectable hydrogen and no significant amount of water vapor formed within the package housing.

Various additional modifications will become apparent to those skilled in the art. For example, the hydride forming layer can be an intermetallic compound or alloy such as Iron-Titanium alloys. In such cases, the alloy could be placed in a vacuum chamber where the surface oxide is sputtered off and Pt or Pd deposited on the surface. The resulting member could be soldered or mechanically attached to one of the package inner walls or to the lid. Further, while the layer, 32, was platinum, a palladium layer is also preferred.

The invention claimed is:

1. An hermetic package comprising:
   a housing for enclosing components; and
   a member within the housing and separate from the components, said member comprising a first layer of a material which forms a hydride when subjected to solvated hydrogen, and a second layer formed over the first layer, the second layer comprising a noble metal material which forms solvated hydrogen when subjected to molecular hydrogen and prevents formation of an oxide on the surface of the member.

2. A package according to claim 1 wherein the first layer comprises titanium and the second layer comprises platinum.

3. A package according to claim 1 wherein the first layer has a thickness greater than 200 nanometers, and the second layer has a thickness within the range 50 nanometers to 500 nanometers.

4. A package according to claim 1 wherein the area of the member is at least 1 percent of the interior package area or greater than 10x the total area of exposed at-risk material in the devices to be protected, whichever is the greater.

5. A package according to claim 1 wherein the package includes a lid for sealing the interior of the housing, and the member is mounted to an inner surface of the lid.

6. A package according to claim 5, wherein the member is bonded to the lid by solder.

7. A package according to claim 5 wherein the layers are deposited on the inner surface of the lid.

8. A package according to claim 1 wherein the components include optical and/or microelectronics components.

9. A package according to claim 1 wherein the materials of the layers are such that the transfer of hydrogen from the first layer to the second is endothermic.

10. A package according to claim 1 wherein the member is mechanically affixed to an interior surface of the package.

* * * * *